US006501361B1

(12) United States Patent
Michaels et al.

(10) Patent No.: US 6,501,361 B1
(45) Date of Patent: Dec. 31, 2002

(54) ROTARY TRANSFORMER WITH SYNCHRONIZED OPERATION

(75) Inventors: Paul A. Michaels, Livonia, MI (US); Irvin B. Rea, Royal Oak, MI (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 09/881,429

(22) Filed: Jun. 14, 2001

(51) Int. Cl.[7] .......................... H01F 27/28; H03L 4/38

(52) U.S. Cl. ...................... 336/182; 333/24 R; 336/212

(58) Field of Search ...................... 333/24 R; 280/735; 307/10.1; 336/212, 182

(56) References Cited

U.S. PATENT DOCUMENTS

| | | | | |
|---|---|---|---|---|
| 3,961,526 A | * | 6/1976 | Himmelstein | 73/136 |
| 4,364,004 A | * | 12/1982 | Bourbeau | 318/721 |
| 4,528,603 A | * | 7/1985 | Abe | 360/70 |
| 5,594,176 A | | 1/1997 | Kiefer | 73/623 |
| 5,608,771 A | * | 3/1997 | Steigerwald et al. | 378/15 |
| 6,121,692 A | | 9/2000 | Michaels et al. | 307/10.1 |
| 6,133,741 A | | 10/2000 | Mattes et al. | 324/502 |
| 6,175,461 B1 | | 1/2001 | Fukuda et al. | 360/64 |

* cited by examiner

*Primary Examiner*—Anh Mai
(74) *Attorney, Agent, or Firm*—Rader, Fishman & Grauer PLLC

(57) ABSTRACT

A rotary transformer includes a resonant circuit and a coil drive circuit. The resonant circuit includes a resonating capacitor connected to a power MOS transistor, coupled across the primary coil of the transformer. The coil drive circuit includes a diode connected to a power MOS transistor coupled across the primary coil of the transformer. A microprocessor detects changes in the voltage across the primary coil. The resonant circuit is connected and disconnected from the transformer during a power transfer mode and a data transfer mode, respectively. During the power transfer mode, stored energy in the leakage inductance of the primary coil is used for power coupling, via the resonant circuit, instead of being dissipated as heat. The resonant circuit is disconnected from the rotary transformer during the data transfer mode to maximize bandwidth for two-way data transfer between the primary and secondary sides of the transformer. The transformer uses a synchronous mode of operation in which the power MOS transistor of the coil drive circuit is turned on when the voltage across the primary coil changes from a positive to a negative value during the power transfer mode. The synchronous mode of operation virtually eliminates a current spike through the diode of the coil drive circuit and provides the microprocessor an appropriate amount of time to recognize the voltage changes across the primary coil.

18 Claims, 4 Drawing Sheets

FIG 1
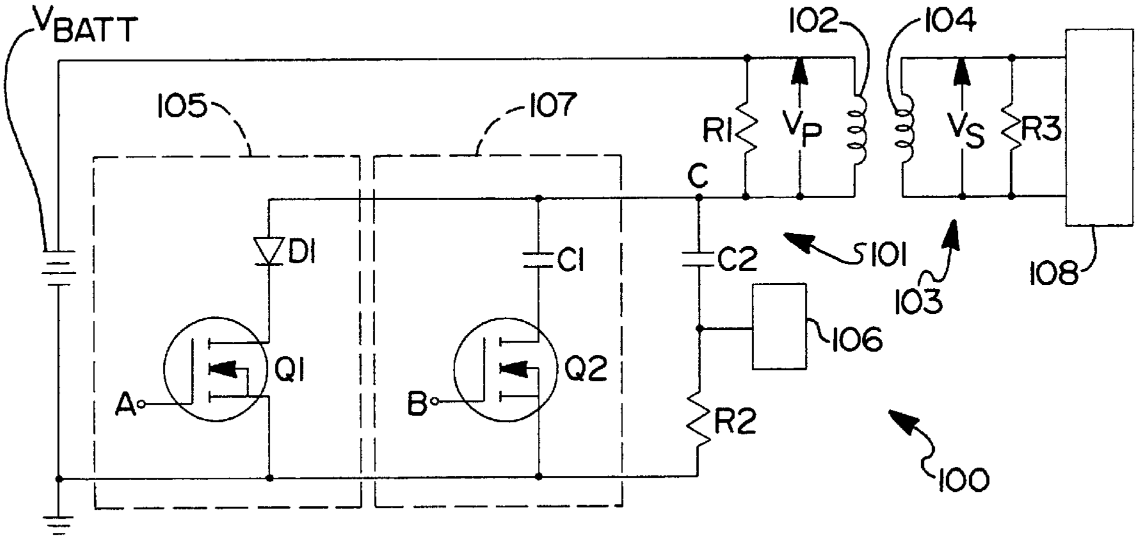
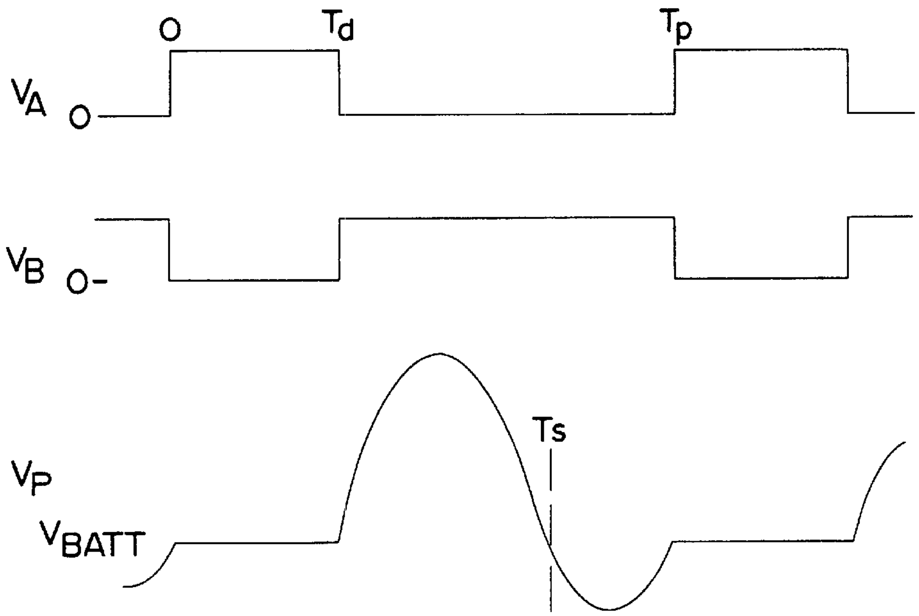
FIG 2
CONSTANT FREQUENCY MODE

VOLTAGE AND CURRENT WAVEFORMS
FIXED FREQUENCY DRIVE

VOLTAGE AND CURRENT WAVEFORMS
IN SYNCHRONOUS MODE OPERATION

FIG 5
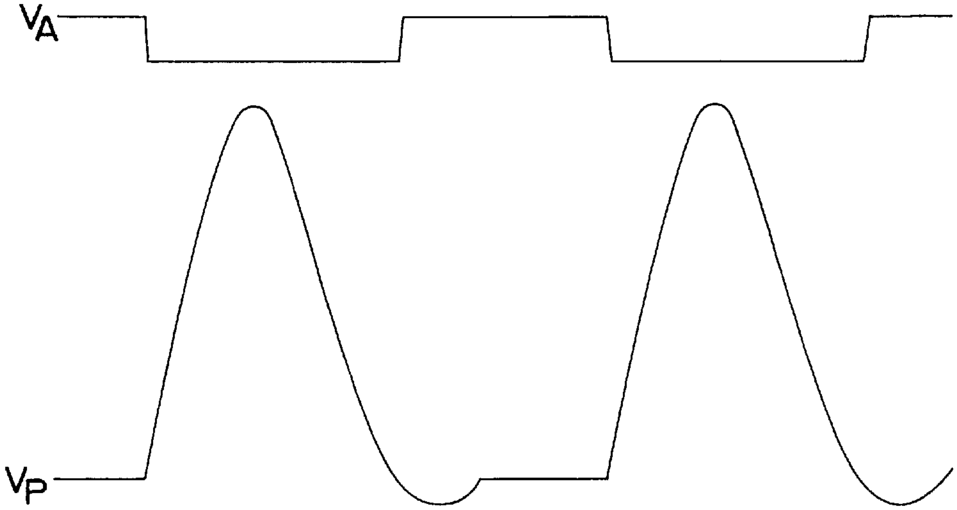
SYNCHRONOUS MODE-
NOMINAL BATTERY AND LOAD
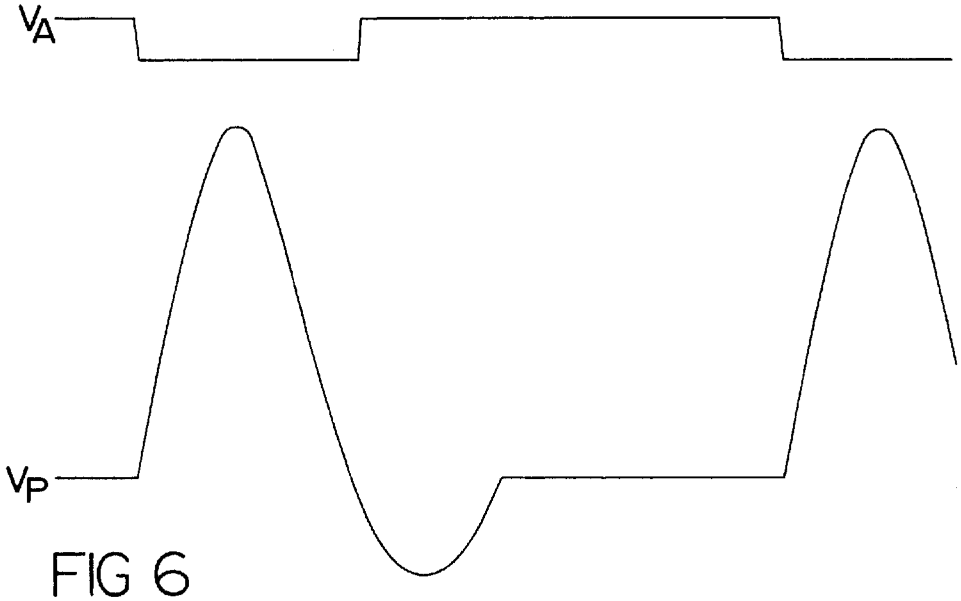
FIG 6
SYNCHRONOUS MODE-
LOW BATTERY NOMINAL LOAD

ROTARY TRANSFORMER WITH SYNCHRONIZED OPERATION

BACKGROUND OF THE INVENTION

1. Field of the Invention

The present invention is directed to rotary transformers, and more particularly to a rotary transformer with a synchronized mode of operation that transfers both power and data between two structures.

2. Description of the Related Art

Rotary transformers are often used for transmitting both data and power between two structures that rotate relative to one another, such as between a vehicle tire and its corresponding wheel axle in a tire pressure sensor system. In another example, a rotary transformer can be used to couple data and power from a steering column to a steering wheel, as disclosed in co-assigned U.S. Pat. No. 6,121,692, the entire contents of which are herein incorporated by reference.

As is known in the art, loosely coupled power transformers do not conduct power efficiently between the primary and secondary of the transformer. Instead, a part of the input current into the primary coil stores energy in the leakage. inductance of the coil. Prior art structures often include a Zener diode across the primary to absorb the energy of the voltage spike that occurs in the transformer when the current to the primary coil is turned off. More particularly, the Zener diode will conduct current before the drive transistor in the primary side breaks down. However, under this approach, the stored energy is dissipated as heat, thereby wasting the energy built up in the primary coil's leakage inductance and lowering the power coupling efficiency of the transformer.

To overcome this problem, conventional rotary transformer designs tend to focus on methods of increasing the coupling efficiency by constructing a magnetically efficient structure for power transmission, such as by using more expensive, high-efficiency core materials, and then adding a complex load impedance mechanism for providing limited two-way communication through the transformer. This results in an overly complicated structure requiring close mechanical tolerances, which increases the manufacturing cost of the system. Further, the bandwidth for these structures tends to be relatively narrow, which limits the amount of data or the speed at which data can be transmitted between the primary and secondary sides of the transformer.

To increase the bandwidth in the rotary transformer, a loosely coupled rotary transformer that includes a resonant circuit, such as a resonating capacitor connected to a power MOS transistor, may be coupled across the primary coil of the transformer, as described in co-pending, co-assigned U.S. patent application Ser. No. 09/395,817 filed on Sep. 14, 1999, the entire contents of which are herein incorporated by reference. In the loosely coupled rotary transformer, the resonant circuit is connected and disconnected from the transformer during a power transfer mode and a data transfer mode, respectively. During the power transfer mode, stored energy in the leakage inductance of the primary coil is used for the power coupling, via the resonant circuit, instead of being dissipated as heat. The resonant circuit is disconnected from the rotary transformer during the data transfer mode to maximize bandwidth for two-way data transfer between the primary and secondary sides of the transformer. Including the resonant circuit in the loosely coupled transformer optimizes data and power transfer without requiring the use of high-cost, high-efficiency magnetic structures in the core of the transformer.

The loosely coupled rotary transformer utilizes a fixed frequency drive circuit, and a resonant drive mode that is very power efficient compared to other known rotary transformer drive methods. The transformer resonant frequency and drive frequency is matched for the nominal supply voltage and secondary load. However, a problem may arise when the supply voltage is not properly regulated, or the secondary load is subject to large changes from a nominal level. In both cases, the power coupling efficiency may decrease from a nominal level.

The inventors of the present invention have recognized this problem and have modified the operation of the rotary transformer drive circuit to maintain high power efficiency for changes in either supply voltage or secondary load. This is especially important for vehicle operation where the supply voltage for proper operation may vary between a voltage of approximately 9.0 and approximately 16.0 volts, which is almost a 2:1 ratio.

SUMMARY OF THE INVENTION

The invention comprises a rotary transformer with a synchronous mode of operation to facilitate the transfer of power and two-way communications between two structures, such as a column and steering wheel of a vehicle. During normal operation, the rotary transformer repetitively alternates between a power transfer mode and a data transfer mode by multiplexing time across the rotary transformer. A microprocessor supplies a pulse train that periodically applies fill power from a power supply, such as a vehicle battery to the transformer's primary coil, or "column coil." In the referenced prior patent, during the power mode when the pulses supplied to the primary coil are "on", the microprocessor disconnects a resonating or tuning capacitor C1 from the primary coil. When the pulses are "off", the resonating capacitor is reconnected, at which time energy stored in the resonating capacitor is supplied across the rotary transformer. By connecting the resonating capacitor C1 to the primary coil only when the pulses are turned "off", the power required to drive the rotary transformer is minimized and the energy recovered from the primary coil is maximized. For synchronized operation, the subject of this application, the tuning capacitor is connected during the entire power mode. It is disconnected only during the data transfer mode. The microprocessor can also adjust the width of the pulses supplied to the primary coil to maintain a constant power level at the wheel circuit using means well known in the art, such as a voltage regulator.

After a preset length of time allotted for the power transfer mode, the microprocessor causes the primary circuit to change to the data transfer mode. During this mode, the primary circuit transmits a preset number of data bits to the secondary side across the rotary transformer, and then the secondary side transmits a preset number of bits to the primary circuit across the rotary transformer. Then, the circuit returns to the power transfer mode and repeats the sequence.

One aspect of the invention is that during the power transfer mode, the drive transistor of the coil drive circuit is switched "on" when the voltage across the primary coil changes from positive to negative at approximately one half of a cycle to provide a synchronous mode of operation. This synchronized mode of operation virtually eliminates a current spike through the diode of the coil drive circuit that exists using conventional modes of operation, which turn the drive transistor "on" at the end of the power transfer mode, such as in fixed frequency and variable frequency modes of operation. By preventing the current spike through the diode of the coil drive circuit, the stress to the driving transistor and electromagnetic interference to the operating environment of the rotary transformer are minimized. In addition, the synchronous mode operation of the invention provides the microprocessor a sufficient amount of time to recognize the change of the resonant waveform of the primary circuit during the power transfer mode so that it can change the output ports, unlike conventional modes of operation.

BRIEF DESCRIPTION OF THE DRAWINGS

In the drawings:

FIG. 1 shows a rotary transformer drive circuit used for fixed frequency, variable frequency or synchronized modes of operation.

FIG. 2 shows the associated waveforms for the rotary transformer drive circuit of FIG. 1 in the fixed frequency operation mode.

FIG. 5 shows the waveforms for the rotary transformer drive circuit of the invention in FIG. 4 for a nominal supply voltage of approximately 14V and a nominal secondary load.

FIG. 6 shows the waveforms for the rotary transformer drive circuit of the invention in FIG. 4 for a low supply voltage of 8V and a nominal secondary load.

DESCRIPTION OF THE PREFERRED EMBODIMENT

Figure 3:
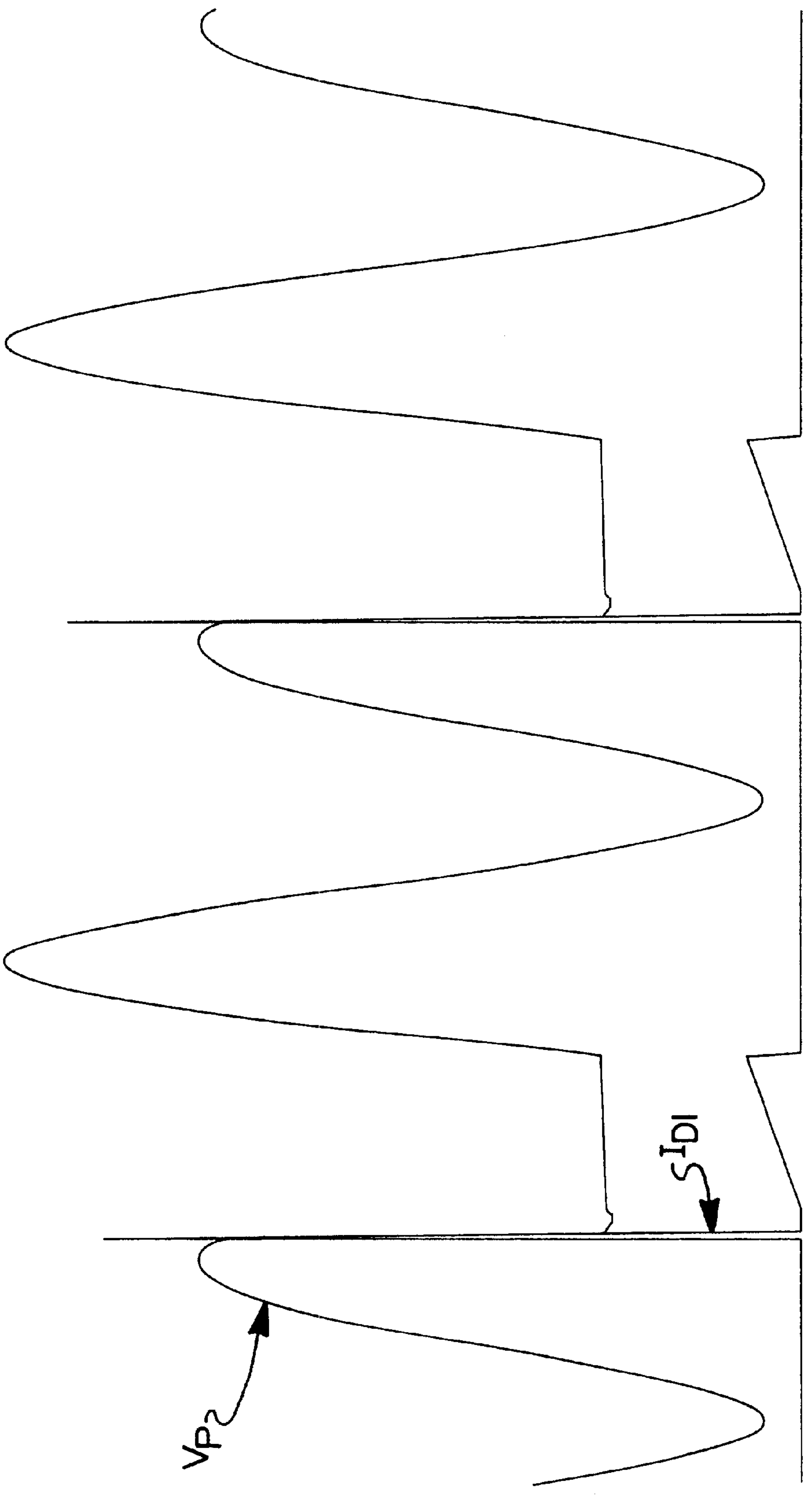
FIG. 3 shows the waveforms for the rotary transformer drive circuit of FIG. 1 when the supply voltage is larger than the minimum level and the secondary load is less than its maximum level.

FIG. 1 shows a rotary transformer 100 using a fixed frequency to transfer power and data between two structures, such as a column circuit and a wheel circuit of a steering wheel of a vehicle. The transformer 100 includes a primary side 101 having a primary coil 102 and a secondary side 103 having a secondary coil 104. The voltage potential across the primary coil 102 is referred to as Vp, and the current passing through the primary coil 102 is referred to as Ip. The voltage potential across secondary coil 104 is referred to as Vs. Resistors R1 and R3 are placed across the primary coil 102 and secondary coil 104, respectively, to control any ringing produced by the transformer 100 due to the loose coupling. Typically, the resistance values of resistors R1 and R3 are reduced until the primary and secondary resonant circuits formed by the transformer's 100 leakage inductance and stray capacitance are critically damped. As a result, when the capacitor C1 is disconnected during the power transfer mode, the transformer's 100 bandwidth is very large, allowing the invention to transmit digitally controlled pulse trains as well as various limited bandwidth sine wave coding schemes, such as frequency-shift keying (FSK) or other comparable schemes. Thus, the large bandwidth produced by the structure in FIG. 1 allows large amounts of virtually any data type to be transmitted between the primary and secondary sides, which is advantageous in various automotive applications.

A resonating capacitor C1 and a drive transistor Q2 are placed across the primary coil 102 to form a resonant circuit 107. As a result, the stored energy in the leakage inductance of the primary coil 102 is coupled to the resonating capacitor C1 when the drive transistor Q2 is turned off. In doing so, the primary side of the transformer 100 continues to couple energy to the secondary side after the drive transistor Q2 is turned off, increasing the power coupling efficiency and decreasing the overall amount of heat generated by the transformer 100.

The rotary transformer 100 also includes a diode D1 connected to the collector of the transistor Q1, which is illustrated as an n-channel MOS driver to form a coil drive circuit 105. The diode D1 has a negligible effect on the data transfer and permits the primary voltage Vp to go below ground, as illustrated in FIG. 2, thus extending the period of active power coupling between the primary and secondary sides of the transformer 100. The increase in the power coupling time generally increases the overall power efficiency enough to more than compensate for the additional loss due to the forward voltage drop across diode D1. If transistor Q1 is a bipolar NPN transistor rather than an n-channel MOS driver as described above, diode D1 may not be needed, provided that the collector swing of the bipolar NPN transistor is less than its base-emitter breakdown voltage.

In FIG. 1, a series connected capacitor C2 and a resistor R2 is connected between the driven side of the coil 102 and the common ground. This permits the AC voltage at the drive side of coil 102, Point C, to be coupled to a microcomputer 106, which controls the signals applied to control inputs A and B. In a preferred embodiment, the pulse train is supplied at a frequency of approximately 25 kHz. The pulse duration of the pulse train determines the amount of power that is transferred from the primary side to the secondary side of transformer 100. As shown in FIG. 1, a full wave rectifier 108 may be connected to the transformer 100 to extract the power being coupled to the secondary side during the power transfer mode.

A preferred set of waveforms for the power transfer mode of the non-synchronized operating mode of the prior art is shown in FIG. 2. In operation, a positive control voltage $V_A$ applied to the gate of drive transistor Q1 of the coil drive circuit 105 turns Q1 on. Simultaneously an inverted control voltage $V_B$ is applied to the gate of transistor Q2 of the resonant circuit 107 to turn Q2 off. As a result, the primary coil 102 has a voltage potential very close to ground potential, and the voltage Vp across the primary coil 102 is approximately equal to $V_{BATT}$. After a delay of Td, the drive transistor Q1 of the coil drive circuit 105 is turned off and the drive transistor Q2 of the resonant circuit 107 is turned on. The stored energy in the leakage inductance of the primary coil 102 generates a damped sine wave for voltage Vp across the primary coil 102. Provided that the load is at its maximum level and the battery voltage $V_{BATT}$ is at its minimum level, and the resonating capacitor C1 is sized for these levels, the sine wave will have just completed one cycle at time Tp when the cycle will be repeated.

As shown in the waveforms of FIG. 2, the resonating capacitor C1 is disconnected by turning drive transistor Q2 off whenever drive transistor Q1 is turned on. As a result, drive transistor Q1 does not have to supply any current $I_{C1}$ to resonating capacitor C1, allowing all of the drive current to go to the transformer 100. When the drive transistor Q2 is turned off, the stored energy in the primary leakage inductance resonantly couples the resonating capacitor C1 to the transformer 100 and then moves back to the primary leakage inductance for continuous power coupling with the secondary side. In other words, placing the resonating capacitor C1, rather than a Zener diode, across the primary coil 102 allows the energy stored in the primary leakage inductance of the coil 102 to be used for power coupling rather than wasted as dissipated heat. Note that power MOS transistors can conduct in either direction, a function that is necessary for resonating capacitor C1 to be effective as a resonating capacitor in the illustrated embodiment. If a bipolar NPN transistor were to be used instead of the power MOS transistor Q2, a diode would need to be placed between the collector and emitter terminals of the bipolar NPN transistor for the circuit to function in the same manner as a circuit containing the power MOS transistor.

Resonating capacitor C1 increases the power coupling efficiency of the inventive transformer 100. However, the resonating capacitor C1 tends to limit the bandwidth of the data transfer to an undesirably low level. To avoid this problem, the invention preferably time-multiplexes the data and the power modes, continuously switching between the two modes to provide both efficient power transfer and a wide bandwidth for two-way data transfer. More particularly, control voltage $V_B$ is input into drive transistor Q2, turning drive transistor Q2 on and off to connect and disconnect resonating capacitor C1 and switch the transformer 100 between operating in the power transfer mode for a fixed time period, e.g. 5 ms, and in the data mode for a fixed time period, e.g. 500 μs.

The transformer 100 preferably cycles continuously between the two modes. The bit rate and/or the duration of the data transfer mode can be modified in any known manner to optimize the amount of data transferred between the primary and secondary sides. For example, using a 100 kHz data rate (10 μs period) transfers 50 bits of data between the primary side and the secondary side in 500 μs Experimental studies with a low-cost air core transformer show that data bit rates over 1 MHz are possible in the invention. Furthermore, inserting a 500 μs data transfer period once every 5 ms of power transfer time reduces the power mode duty factor by only 10%. Depending on the particular application in which the inventive transformer circuit is used, the length of the data transfer period can be smaller than 0.1% of the power transfer period.

One advantage of the invention is that the transformer 100 provides both an acceptable power transfer and data transfer without requiring specialized, higher-cost magnetic materials, allowing the inventive circuit to be manufactured with lower-cost, easily available air core transformers. More particularly, including a resonant control circuit 103 across the primary coil 102 in a loosely coupled transformer allows energy stored in the leakage inductance of the primary coil 102 to be coupled to the secondary side rather than being wasted as dissipated heat. Further, the invention can switch between power transfer and data transfer modes by simply connecting and disconnecting the resonant control circuit 103, making the circuit of the invention much simpler than known structures using complex load impedance mechanisms for generating data transfer capabilities in a transformer.

Under normal operating conditions, the supply voltage $V_{BATT}$ is larger than the minimum level, and the load is less than its maximum level. The pulse width will be decreased to maintain a constant secondary voltage Vs. Under these conditions the resonant sine wave will be interrupted after more than a complete cycle has been completed. The resulting waveforms, shown in FIG. 3, disclose a very high spike in the current through diode D1 as the driving transistor Q1 is turned on. The spike not only increases stress to the driving transistor Q1, but also causes electromagnetic interference that is not desirable in the automotive environment.

One solution to these problems is to operate the transformer 100 at a variable frequency, rather than at a fixed frequency described above. Operating the transformer 100 at a variable frequency permits precisely one cycle of the data transfer mode before switching to the power mode of operation. Operating the transformer 100 at a variable frequency could be accomplished by monitoring the transformer primary voltage Vp at point C and turning the drive transistor Q1 on and the resonating capacitor C1 offjust as the primary voltage Vp changes from negative to positive at time Td.

However, some problems may exist using the variable frequency approach described above. One problem is that the rate of change of the waveform for the primary voltage Vp occurs in about four (4) to six (6) volts per microsecond. As a result, the microprocessor 106 would have to recognize the change in the primary voltage Vp from a negative-to-positive voltage and then change the output ports all within about 0.2 μs, which may be impractical for a low cost automotive microprocessor.

The inventors have recognized this problem and have provided a transformer 100 with a synchronous mode of operation that virtually eliminates the spike in the current through diode D1 when the driving transistor Q1 is turned on while providing the microprocessor an adequate amount of time to change the output ports.

Figure 4:
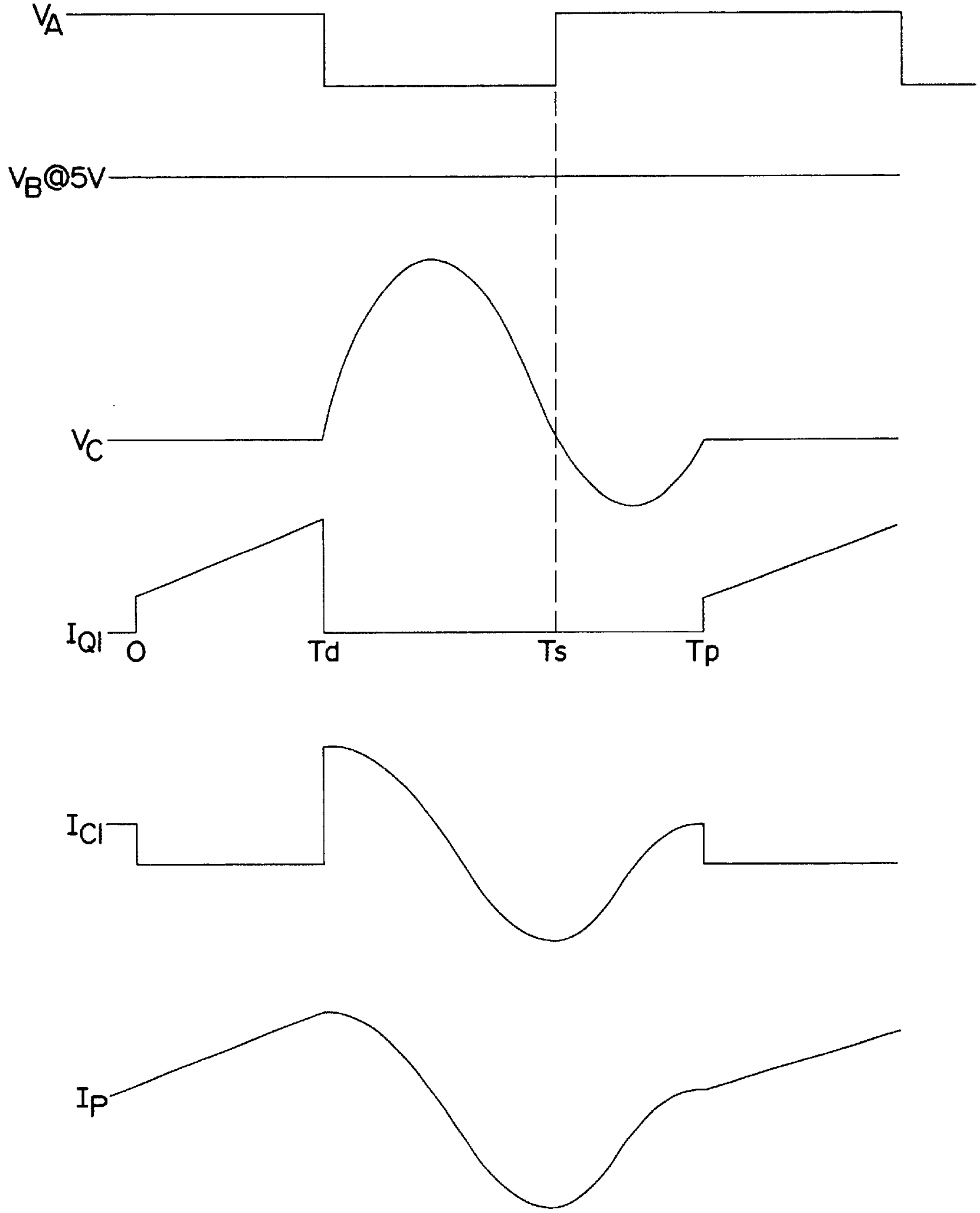
FIG. 4 shows the waveforms of a rotary transformer drive circuit having synchronous operation according to an embodiment of the invention.

Referring now to FIG. 4, the drive transistor Q1 is switched on when the voltage at Point C changes from negative to positive at one half of a cycle at time Ts, rather than at the end of each complete cycle at time Td as in conventional transformers. When the drive transistor Q1 is turned on at time Ts, the drive current Ip will not flow because of diode D1 and a negative primary voltage Vp at Point C, as shown in FIG. 1. After a half cycle when the voltage Vp at Point C changes from negative to positive, the drive current $I_{Q1}$ will automatically flow because the drive transistor Q1 has already been switched on. It will be appreciated that the time Ts may occur when the primary voltage Vp is slightly positive because the primary voltage Vp may not drop completely to zero during the data transfer mode.

Using the synchronous mode of operation of the invention, the amount of time for the microcomputer 106 to change the output ports is greatly improved as compared to conventional approaches. For example, at a resonant frequency of approximately 50 kHz, the microcomputer 106 has 10 microseconds to recognize a state change a resonant frequency of approximately 50 kHz using the invention, instead of 0.2 microseconds using conventional approaches. Thus, the invention provides a factor of 50 reduction in speed requirement of the microprocessor 106 and the speed requirement of the microprocessor 106 practical in an automotive environment. Moreover, because the capacitor C1 is charged to less than one volt, the resonating capacitor C1 does not have to be switched off during the power transfer mode of operation. Because the drive current $I_{Q1}$ is switched from off-to-on and from on-to-off at essentially zero voltage across the resonating capacitor C1, there are no large current spikes, as shown in FIG. 4. Instead, the primary coil 102 of transformer 100 can simply switch between the resonating capacitor C1 and the drive transistor Q1.

In summary, the invention switches the drive transistor Q2 on to connect the resonating capacitor C1 to the primary coil 102 during the power transfer mode and disconnected during the data transfer mode. During the power transfer mode, the microcomputer 106 detects the transition of voltage Vp across the primary coil 102 (at point C) from a positive-to-negative and turns the drive transistor Q1 on. The drive transistor Q1 is switched off when the coupled energy to the transformer secondary coil 104 is sufficient to provide sufficient power to the secondary side.

One aspect of the invention is that at nominal power loads, the transformer 100 using the synchronous mode of operation of the invention has the same power efficiency as a transformer using a fixed frequency mode of operation. Another aspect of the invention is that when the supply voltage, $V_{BATT}$ or the secondary load changes, the invention can adapt and maintain very high power efficiency.

FIG. 5 shows the waveforms for the control voltage $V_A$ and the transformer primary voltage Vp for a battery voltage $V_{BATT}$ of approximately 14 volts and a nominal secondary load using the synchronous mode of operation of the invention. As can be seen in FIG. 5, the transitions between the power transfer and data transfer modes are continuous without any abrupt discontinuities at the mode changes.

FIG. 6 shows the waveforms for the control voltage $V_A$ and the transformer primary voltage Vp that result when the battery voltage, $V_{BATT}$, drops from approximately 14 volts to about 8 volts with approximately the same secondary load as in FIG. 5. As seen in FIG. 6, the period for the power transfer mode is longer to supply the same average power to the secondary side at a lower supply voltage, $V_{BATT}$. However, the transitions between the power transfer and data transfer modes are continuous and lack any abrupt discontinuities at the mode changes, similar to the waveforms in FIG. 5.

While the invention has been specifically described in connection with certain specific embodiments thereof, it is to be understood that this is by way of illustration and not of limitation, and the scope of the appended claims should be construed as broadly as the prior art will permit.

What is claimed is:

1. A rotary transformer, comprising:

a primary coil;

a secondary coil;

a resonant circuit coupled to the primary coil;

a coil drive circuit coupled to the primary coil; and a microprocessor connected to the primary coil for detecting a voltage across the primary coil, wherein a control voltage is input to the coil drive circuit when the microprocessor detects a transition of the voltage across the primary coil from a positive voltage to a negative voltage.

2. The transformer according to claim 1, wherein the coil drive circuit includes a diode connected to the primary coil and a first drive transistor connected to the diode.

3. The transformer according to claim 2, wherein the resonant circuit includes a resonating capacitor connected to the primary coil and a second drive transistor connected to the resonating capacitor.

4. The transformer according to claim 3, wherein a control voltage input to the second drive transistor turns the second drive transistor on to connect the capacitor to the primary coil during a power transfer mode.

5. The transformer according to claim 4, wherein the transition of the voltage across the primary coil from the positive voltage to the negative voltage occurs during the power transfer mode.

6. The transformer according to claim 5, wherein the transition occurs at approximately half cycle of the power transfer mode.

7. The transformer according to claim 3, wherein a control voltage input to the second drive transistor turns the second drive transistor off to disconnect the capacitor from the primary coil during a data transfer mode.

8. The transformer according to claim 1, further comprising a full-wave rectifier coupled to the secondary coil.

9. A rotary transformer, comprising:

a primary coil;

a secondary coil;

a resonant circuit coupled to the primary coil, the resonant circuit including a capacitor connected to the primary coil and a first drive transistor connected to the capacitor; and a coil drive circuit coupled to the primary coil, the coil drive circuit including a diode connected to the primary coil and a second drive transistor connected to the diode, wherein a control voltage input to the second drive transistor turns the second drive transistor on when a voltage across the primary coil transitions from a positive voltage to a negative voltage.

10. The transformer according to claim 9, wherein a control voltage input to the first drive transistor turns the first drive transistor on to connect the capacitor to the primary coil during a power transfer mode.

11. The transformer according to claim 10, wherein a control voltage input to the first drive transistor turns the drive transistor off to disconnect the capacitor from the primary coil during a data transfer mode.

12. The transformer according to claim 10, wherein the transition of the voltage across the primary coil from the positive voltage to the negative voltage occurs during the power transfer mode.

13. The transformer according to claim 12, wherein the transition occurs at approximately half cycle of the power transfer mode.

14. The transformer according to claim 9, further comprising a full-wave rectifier coupled to the secondary coil.

15. A method of operating a rotary transformer having a primary coil, a second coil, a resonant circuit coupled to the primary coil, a coil drive circuit coupled to the primary coil, the method comprising the steps of:

supplying a control voltage to the resonant circuit;

detecting a transition of a voltage across the primary coil when the control voltage is supplied to the resonant circuit; and supplying a control voltage to the coil drive circuit when the transition of the voltage across the primary coil is detected in the detecting step.

16. The method according to claim 15, wherein the transition of the voltage across the primary coil comprises a transition from a positive voltage to a negative voltage.

17. The method according to claim 15, wherein the resonant circuit comprises a resonating capacitor connected to the primary coil and a second drive transistor connected to the resonating capacitor.

18. The method according to claim 15, wherein the coil drive circuit comprises a diode connected to the primary coil and a second drive transistor connected to the diode.

* * * * *